(12) United States Patent
Elnathan et al.

(10) Patent No.: US 7,511,762 B2
(45) Date of Patent: Mar. 31, 2009

(54) GENERATION OF A FRAME SYNCHRONIZED CLOCK FOR A WIRELESS VIDEO RECEIVER

(75) Inventors: Nathan Elnathan, Raanana (IL); Shay Freundlich, Givat Ada (IL)

(73) Assignee: Amimon Ltd., Herzlia (IL)

( * ) Notice: Subject to any disclaimer, the term of this patent is extended or adjusted under 35 U.S.C. 154(b) by 330 days.

(21) Appl. No.: 11/470,582

(22) Filed: Sep. 6, 2006

(65) Prior Publication Data
US 2008/0055485 A1    Mar. 6, 2008

(51) Int. Cl.
H04N 9/44 (2006.01)
H04N 9/455 (2006.01)

(52) U.S. Cl. ...................... 348/500; 348/537

(58) Field of Classification Search ........... 348/500, 348/521, 524, 536, 537, 540, 547, 725; 375/240.28, 375/354, 373, 362, 375, 376, 371; H04N 9/44, H04N 9/455, 5/06, 9/45, 5/45, 5/05
See application file for complete search history.

(56) References Cited

U.S. PATENT DOCUMENTS

| 5,939,947 | A | 8/1999 | Nako et al. |
|---|---|---|---|
| 6,310,653 | B1 | 10/2001 | Malcolm, Jr. et al. |
| 6,404,818 | B1 | 6/2002 | Obikane |
| 7,024,575 | B2 * | 4/2006 | Lienhart et al. ............. 348/500 |
| 7,064,621 | B2 | 6/2006 | Nakanishi |
| 2006/0209745 | A1 | 9/2006 | MacMullan et al. |
| 2006/0209890 | A1 | 9/2006 | MacMullan et al. |
| 2006/0209892 | A1 | 9/2006 | MacMullan et al. |
| 2006/0212911 | A1 | 9/2006 | MacMullan et al. |
| 2007/0098063 | A1 | 5/2007 | Reznic et al. |

FOREIGN PATENT DOCUMENTS

| WO | 2006101801 | 9/2006 |
|---|---|---|
| WO | 2006118964 | 11/2006 |

OTHER PUBLICATIONS

International Search Report for PCT/IL07/01095 dated Sep. 15, 2008.

* cited by examiner

*Primary Examiner*—Sherrie Hsia
(74) *Attorney, Agent, or Firm*—EMPK & Shiloh, LLP

(57) ABSTRACT

An apparatus for receiving essentially uncompressed HDTV video must generate an accurate pixel-rate clock to enable the reconstruction of a video frame. The clock pixel-rate generated must match a received video pixel-rate. In such system, signals for generation of horizontal and vertical synchronization are not transmitted over the wireless link to conserve the use of bandwidth. In the invention, a start of frame (SOF) indication is extracted by a symbol detection and synchronization (SDS) module and is used to generate the pixel-rate clock.

16 Claims, 2 Drawing Sheets

GENERATION OF A FRAME SYNCHRONIZED CLOCK FOR A WIRELESS VIDEO RECEIVER

BACKGROUND OF THE INVENTION

1. Field of the Invention

The invention relates generally to the reception of uncompressed video over a wireless link. More specifically, the invention relates to the generation of a synchronization clock that is correlated to video frames received over a wireless link.

2. Description of the Prior Art

In common video reception systems, there are video control signals, such as the horizontal synchronization (Hsync) signal and the vertical synchronization (Vsync) signal. The Hsync and the Vsync signals may be used to generate a video pixel clock. Such signals may also be sent over the air for wireless transmission of video. However, the amount of bandwidth that is required to send these signals decreases the amount of bandwidth that is available for sending video data, i.e. significant portions of the available bandwidth are used to send such control signals.

The video source is usually comprised of a video data signal, such as RGB or YcCrCb, and controls, such as Hsync, plus Vsync or synchronization on green (SOG). Hsync and SOG provide information about the start of each video line. Vsync provides information about each video frame. When transmitting a video signal to a digital interface, the Hsync or SOG generate a video clock using a phase-locked loop (PLL). The PLL adjusts the clock such that it has a specific number of clocks between Hsync signals, although the Hsync itself may have a jitter. When Hsync jitters, the video source rate also fluctuates. In wired systems, generation of a video clock using Hsync allows the video system to accommodate the jittering of the video source.

Wireless systems traditionally use compressed formats as the video sources, and use a local oscillator for the video clock. Decompression of the video data is performed at the local oscillator frequency, using a local compressed buffer to accommodate clock rate variation. The extraction rate of the compressed video is achieved by using the local oscillator and, hence, the number of clocks in each line between Hsync signals may be handled using the local video clock oscillator.

In cases where the bandwidth is limited or better used for other purposes, for example, for the purpose of the transmission of video information and, in particular, in the case of the transmission of high-definition video information, the allocation of such bandwidth for these purposes is undesirable. For example, in a system described in U.S. provisional patent application Ser. No. 60/729,459, entitled Apparatus and Method for Uncompressed, Wireless Transmission of Video, assigned to common assignee and hereby incorporated by reference for all that it contains (hereinafter the '459 application), there is described such a system. Essentially, in the '459 system the control signals are not transmitted to the receiver and there is no timing information, other than the possibility of extracting a start of frame (SOF) indication.

In wireless systems that do not have any frame buffering or have a minimal buffering, for example the apparatus described in the '459 application, the prior art solutions are not applicable. Firstly, because the system is wireless the Hsync of the transmitter side is physically separated from the receiver side that generates the video clock output. Secondly, because there is no frame buffering a local oscillator cannot be used. The video source on the transmit side jitters relative to the local oscillator of the receive side and no buffering is available to accommodate for such jitter. Hence, in a wireless system having no frame buffering there is a challenge in generating the digital video output in a way that ensures that there are a predefined number of clocks between Hsync signals that are aligned with the video source.

It would therefore be advantageous to provide an apparatus and method thereof for overcoming the limitation of prior art solutions and that enables the generation of the desired clock over a wireless link. It would be further advantageous if such clock synchronization is of particular use with respect to the reception of a high-definition video transmission.

SUMMARY OF THE INVENTION

An apparatus for receiving essentially uncompressed HDTV video must generate an accurate pixel-rate clock to enable the reconstruction of a video frame. The clock pixel-rate generated must match a received video pixel-rate. In such system, signals for generation of horizontal and vertical synchronization are not transmitted over the wireless link to conserve the use of bandwidth. In the invention, a start of frame (SOF) indication is extracted by a symbol detection and synchronization (SDS) module and is used to generate the pixel-rate clock.

DETAILED DESCRIPTION OF EMBODIMENTS

In an apparatus that receives an essentially uncompressed HDTV video there is a need to generate an accurate pixel-rate clock for reconstruction of the video frame. The clock that is generated must match the received video rate. To preserve bandwidth, signals for generation of horizontal and vertical synchronization are not transmitted over the wireless link. In accordance with the invention, the start of frame (SOF) indication that is extracted by a symbol detection and synchronization (SDS) module is used in the generation of the pixel clock. In accordance with the invention Hsync information which is transmitted to enable synchronization of the video signal. The invention uses signaling through the wireless link and reports to the receiver when Hsync occurs in the video source. The receiver then generates the video clock from the received signal using, for example, a phase-locked loop (PLL). In this way, the generated video clock adjusts itself in real-time relative to the fluctuation of the video. This capability allows the use of no buffering or minimal buffering as used, for example, in U.S. provisional patent application Ser. No. 60/729,459, entitled Apparatus and Method for Uncompressed, Wireless Transmission of Video, assigned to common assignee and hereby incorporated by reference for all that it contains (hereinafter the '459 application). A person skilled in the art would note that this reference is made merely for illustration of the invention and should not be viewed as limiting the scope of the invention. The invention has wider application beyond the specific example described herein. Such implementations are intended to be included in the disclosure. It will be further noted that while the descriptions herein are with reference to HDTV, the invention is not limited to any particular video formats or standards.

Figure 1:
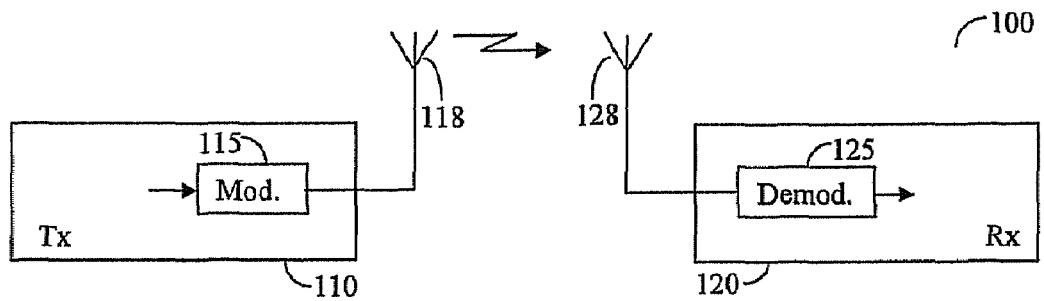
FIG. 1 is a schematic block diagram of a wireless transmitter and receiver system.

A schematic diagram of a transmitter 110 and a receiver 120 is shown in FIG. 1. In the system 100, a modulator 115 receives video frames and, after modulation, the signal is transmitted via a transmitting antenna 118. The signal is received by a receiving antenna 128. The received signal is demodulated by a demodulator 125 and used by other elements of the receiver 120 to reconstruct the respective video frames. An SOF indication extracted is used for synchronization, as described below.

Figure 2:
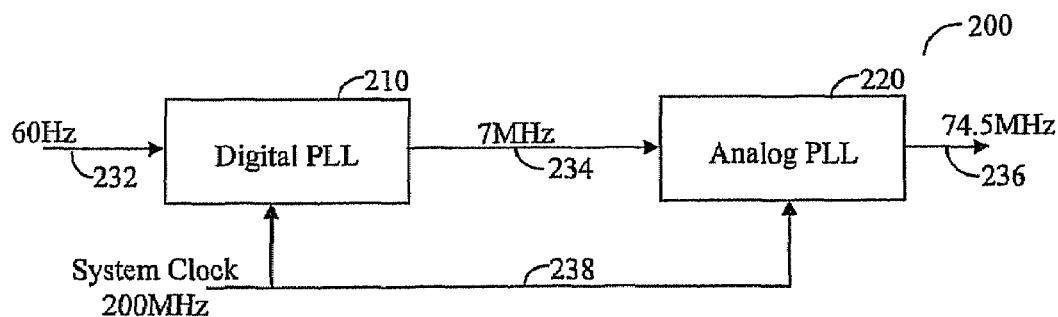
FIG. 2 is a schematic block diagram of a two-stage PLL that is locked on the start-of-frame (SOF)

Significant to the invention is the use of synchronization information, such as the SOF, that is extracted from the information provided over the air. The synchronization information, while low in frequency must synchronize a high frequency signal. Therefore, and as is shown with reference to FIG. 2, a high-frequency PLL capable of synchronization by the relatively low frequency of the SOF is disclosed. The two-stage PLL 200 is comprised of a digital PLL 210 that generates a first signal 234 which is synchronized to the low frequency frame rate of synchronization signal 232, and an analog PLL 220 that generates a second signal 236, which is approximately an order of magnitude higher than the input frequency 234, and which is synchronized to the first signal 234. Both PLLs may be operative with respect to a system signal 238. The synchronization signal 232 may be any periodical information that is acceptable for the purpose of the synchronization of video frames to a reference clock. When the data are transferred over the wireless link as packets, the video frame may be synchronized to the modem packets and, therefore, such information is used for synchronization. A person skilled in the art would appreciate that other periodic data received over the wireless link by the receiver 120 may be used for the generation of the synchronization signal 232.

In one non-limiting example, the 720p standard at a 60 Hz frame rate is considered. The nominal pixel clock is 74.25 MHz, because there are 1650×750=1,237,500 pixels per frame:

$$1650 \times 750 \times 60 = 74{,}250{,}000 \quad (1)$$

Therefore, it is necessary to generate a clock having 1650× 750 pulses between two SOF indications. A presently preferred embodiment of the invention uses a counter mechanism to generate M clock pulses between two SOF indications. An external phase-locked loop (PLL) is used to multiply the M clock pulse by N. M×N is equal to the number of pixels in the frame, e.g. 1650×750 in the 720p standard. In a preferred embodiment of the invention it would be advantageous to select a minimal value for M and maximal value for N. The reason for such a selection is that this approach forces most of the frequency multiplication to be performed by the PLL, which is more accurate. However, a PLL may require a minimal clock frequency, for example a frequency of 1 MHz, and possibly higher than that, which requires a maximal value for M.

Figure 3:
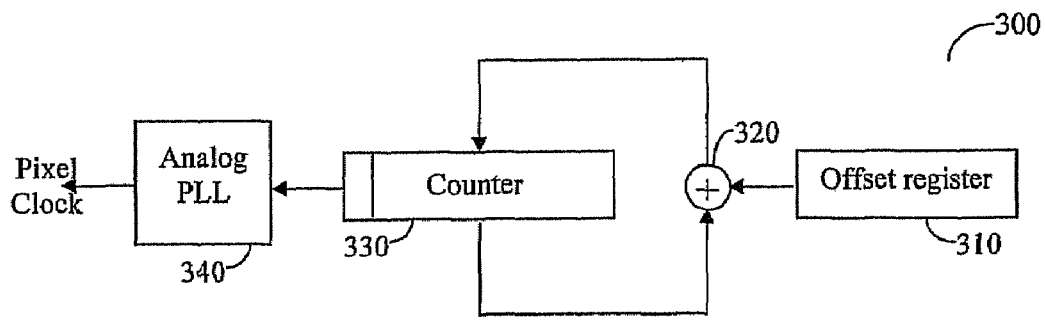
FIG. 3 is a block diagram of a pixel clock generator in accordance with an exemplary of the invention.

FIG. 3 is a block diagram of a pixel clock generator (PCG) 300, in accordance with the disclosed invention. The PCG 300 comprises an offset unit 310 and a counter unit 330. An output of the counter 330 and the offset 310 are added by an adder 320 and loaded into a counter 330, as explained in more detail below. The counter 330 is coupled to a PLL 340 that provides the pixel clock, as explained in more detail below. The PCG 300 adds an offset value to the counter value once each system clock cycle.

The offset register 310 therefore sets the rate of the output clock. If the offset register represents a fraction, then:

$$\text{System\_clk\_rate} \times \text{Offset}/2 = \text{Output\_clk\_rate} \quad (2)$$

If the number of system clock pulses between two SOF indications is L, then the number of output clock pulses between two SOF indications is:

$$L \times \text{Offset}/2 \quad (3)$$

Therefore, the number of bits of the counter and the offset value determine the precision of the fixed point implementation of the offset and, thus, the PCG 300 clock rate.

Figure 4:
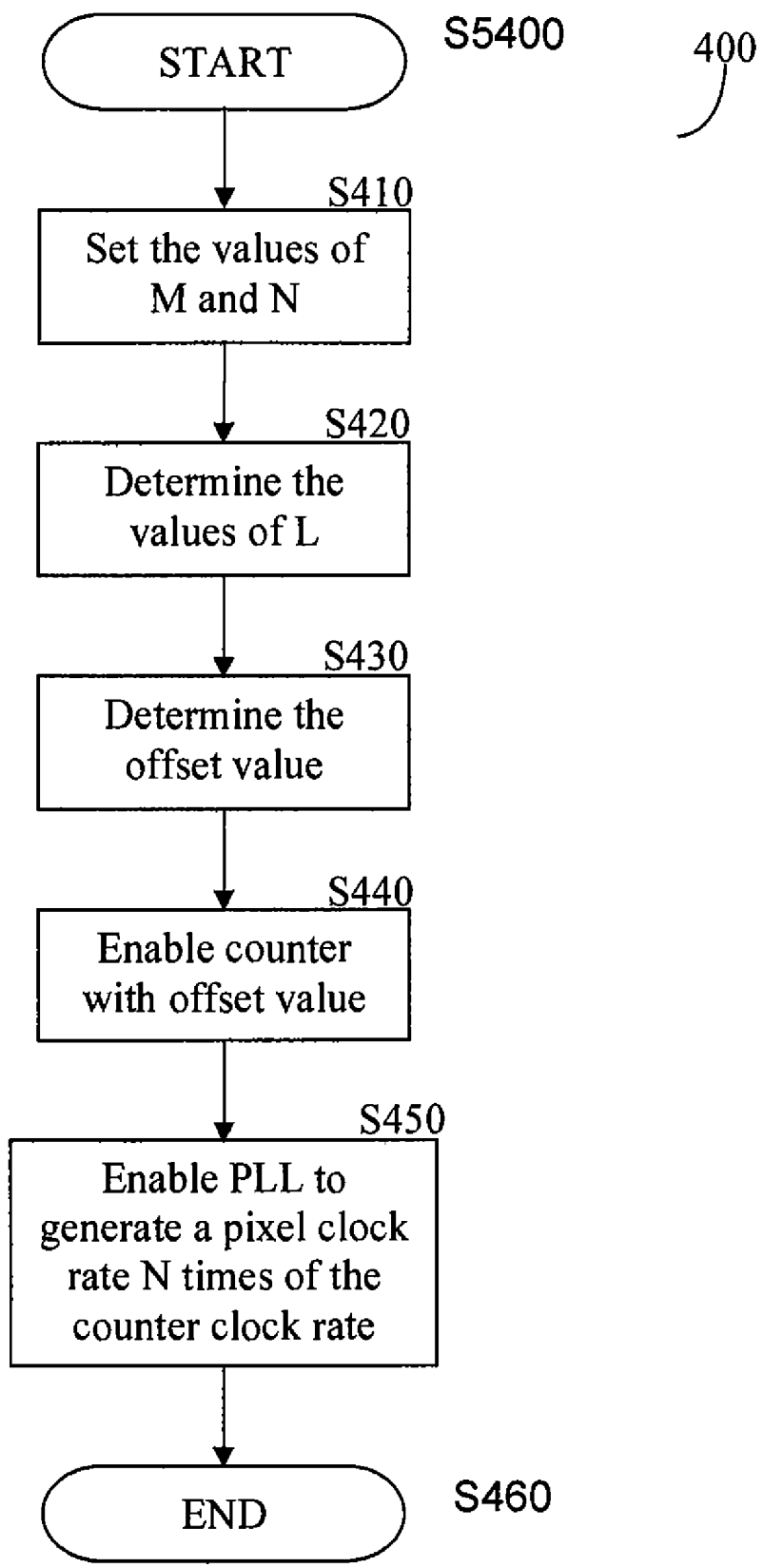
FIG. 4 is a flowchart of a method in accordance with the invention.

FIG. 4, is a flowchart 400 showing a method that enables operation of a PCG, for example the PCG 300. The process commences at step S400. At step S410, the values of M and N are determined, taking into account the considerations discussed above. At step S420, the value of L is calculated as demonstrated above. At step S430, the offset value is calculated based on the values of M and L, or specifically as:

$$\text{offset} = 2M/L \quad (4)$$

At step S440, the offset register, for example the offset register 310, is loaded with an offset value that is calculated in accordance with step S430, and the counter, operating at a system clock rate is thus enabled for counting. The output of the counter 330 is fed to a PLL, for example the PLL 340. At step S45, the PLL generates a pixel clock at a rate that is N times the clock rate provided by the counter 330.

For the 720p standard, the values may be M=123,750 and N=10. In the case of a system clock operating at 100 MHz, L is:

$$L = 100 e^6 / 60 = 1.667 e^6 \quad (5)$$

Therefore, based on equation (4) above, the value of the offset is:

$$\text{Offset} = 2M/L = 123{,}750/1.667 e^6 = 0.1485 \quad (6)$$

The calculation of L is based on nominal values and, thus, may differ from the actual value. Furthermore, L may not be represented precisely as a fixed point value, which may cause an error over time injected to the pixel clock rate. Hence, in one embodiment of the invention a feedback mechanism is used. Such feedback mechanism is based on counting the number of output clock pulses between each two SOF indications. These numbers, as noted above, are known and based on the specific implementation, for example, the 720p standard. As a result of a comparison between the actual pixel clock rate, and the desired pixel clock rate the offset value is either increased or decreased. A person skilled in the art would note that according to this embodiment the control of the offset value is based on the pixel clock from the output of the PLL, for example the PLL 340. This embodiment is particularly beneficial if the PLL, for example the PLL 340, does not precisely multiply the counter clock output by N.

In another embodiment of the invention, the value of L is counted for each frame. As a result, the value of the offset is adjusted to reach the desired pixel clock rate in the next frame. This requires the use of a divider for the calculation of offset. In this embodiment, control of the value of the offset is based on the clock output of a counter, for example the counter 330, which output is an intermediate signal within a PCG, for example the PCG 300.

Based on the clock provided by the PCG 300, a system such as the receiver described in the '459 application can generate the Vsync and Hsync signals. In one embodiment of the invention, generation of the Vsync and Hsync signals is delayed by a few cycles to ensure that the proper clock rate has been reached. This can be done by counting the number of clocks between SOF indications and verifying that the clock maintains its value within a predefined threshold, for example a threshold of no more than ten clocks. Thereafter, once a stable pixel clock rate has been achieved, Vsync and Hsync may be generated by counting exactly the required number of pixel clock pulses between each of them. Hsync information can be derived using a variety of techniques, either using transmitted control information, using in-band or out-of-band transmission, or via any other means. In one embodiment of the invention, the Hsync information is transmitted once per frame using a signal detection and synchronization mechanism.

Although the invention is described herein with reference to the preferred embodiment, one skilled in the art will readily appreciate that other applications may be substituted for those set forth herein without departing from the spirit and scope of the invention. Accordingly, the invention should only be limited by the claims included below.

The invention claimed is:

1. A wireless video receiver to receive a wireless video transmission including data representing pixels of a video frame and a synchronization signal indicative of a beginning of said video frame, said wireless receiver comprising:
a clock generator to generate a pixel clock signal synchronized to said synchronization signal, wherein a clock rate of said pixel clock signal corresponds to a pixel rate of said pixels, said clock generator comprising:
a first clock generation module to generate an intermediate clock signal synchronized to said synchronization signal, wherein an intermediate clock rate of said intermediate clock signal is lower than said pixel rate; and
a second clock generation module to generate said pixel clock signal based on said intermediate clock signal.

2. The wireless video receiver of claim 1, wherein the clock rate of said pixel clock signal is at least ten times greater than said intermediate clock rate.

3. The wireless video receiver of claim 1, wherein the clock rate of said pixel clock signal is at least four orders of magnitude greater than said intermediate clock rate.

4. The wireless video receiver of claim 1, wherein said first clock generation module comprises a digital phase-locked loop, and wherein said second clock generation module comprises an analog phase-locked loop.

5. The wireless video receiver of claim 1, wherein said first clock generation module comprises:
a counter to generate said intermediate clock signal based on a value of said counter;
an offset register to maintain an offset value; and
an adder to add said offset value to the value of said counter at a system clock rate of a system clock of said receiver.

6. The wireless video receiver of claim 5, wherein said clock generator is to adjust the offset value maintained by the offset register based on at least one of said intermediate clock signal and said pixel clock signal.

7. The wireless video receiver of claim 1, wherein said wireless video receiver is capable of generating one or more video control signals based on said pixel clock signal, said video control signals comprising at least one of a horizontal-synchronization signal, a vertical synchronization signal, and a synchronization-on-green signal.

8. A wireless video communication system comprising:
a wireless video transmitter to transmit a wireless video transmission including data representing pixels of a video frame and a synchronization signal indicative of a beginning of said video frame; and
a wireless video receiver to receive said wireless video transmission, said receiver comprising a clock generator to generate a pixel clock signal synchronized to said synchronization signal, wherein a clock rate of said pixel clock signal corresponds to a pixel rate of said pixels,
wherein said clock generator comprises:
a first clock generation module to generate an intermediate clock signal synchronized to said synchronization signal, wherein an intermediate clock rate of said intermediate clock signal is lower than said pixel rate; and
a second clock generation module to generate said pixel clock signal based on said intermediate clock signal.

9. The wireless video communication system of claim 8, wherein the clock rate of said pixel clock signal is at least ten times higher than said intermediate clock rate.

10. The wireless video communication system of claim 8, wherein said first clock generation module comprises a digital phase-locked loop, and wherein said second clock generation module comprises an analog phase-locked loop.

11. The wireless video communication system of claim 8, wherein said first clock generation module comprises:
a counter to generate said intermediate clock signal based on a value of said counter;
an offset register to maintain an offset value; and
an adder to add said offset value to the value of said counter at a system clock rate of a system clock of said receiver.

12. The wireless video communication system of claim 11, wherein said clock generator is to adjust the offset value maintained by the offset register based on at least one of said intermediate clock signal and said pixel clock signal.

13. The wireless video communication system of claim 8, wherein said wireless video receiver is capable of generating one or more video control signals based on said pixel clock signal, said video control signals comprising at least one of a horizontal-synchronization signal, a vertical synchronization signal, and a synchronization-on-green signal.

14. A method of wireless video communication, the method comprising:
receiving a wireless video transmission including data representing pixels of a video frame and a synchronization signal indicative of a beginning of said video frame; and
generating a pixel clock signal synchronized to said synchronization signal, wherein a clock rate of said pixel clock signal corresponds to a pixel rate of said pixels,
wherein generating said pixel clock comprises:
generating an intermediate clock signal synchronized to said synchronization signal, wherein an intermediate clock rate of said intermediate clock signal is lower than said pixel rate; and
generating said pixel clock signal based on said intermediate clock signal.

15. The method of claim 14, wherein the clock rate of said pixel clock signal is at least ten times higher than said intermediate clock rate.

16. The method of claim 14, wherein generating the intermediate clock signal comprises:
generating said intermediate clock signal based on a value of a counter;
maintaining an offset value; and
adding said offset value to the value of said counter at a system clock rate of a system clock.

* * * * *